(12) United States Patent
Chen et al.

(10) Patent No.: US 12,439,515 B2
(45) Date of Patent: Oct. 7, 2025

(54) POWER MODULE AND MANUFACTURING METHOD THEREOF

(71) Applicant: Delta Electronics, Inc., Taoyuan (TW)

(72) Inventors: Jianxin Chen, Shanghai (CN); Kun Jiang, Shanghai (CN); Quansong Luo, Shanghai (CN)

(73) Assignee: Delta Electronics, Inc., Taoyuan (TW)

( * ) Notice: Subject to any disclaimer, the term of this patent is extended or adjusted under 35 U.S.C. 154(b) by 366 days.

(21) Appl. No.: 18/096,356

(22) Filed: Jan. 12, 2023

(65) Prior Publication Data

US 2023/0262889 A1 Aug. 17, 2023

(30) Foreign Application Priority Data

Feb. 14, 2022 (CN) .......................... 202210134656.7

(51) Int. Cl.
*H02M 7/00* (2006.01)
*H05K 1/02* (2006.01)
(Continued)

(52) U.S. Cl.
CPC ............ *H05K 1/113* (2013.01); *H02M 7/003* (2013.01); *H05K 1/0201* (2013.01); *H05K 3/30* (2013.01)

(58) Field of Classification Search
CPC ........ H02M 3/003; H02M 7/003; H02M 7/00; H05K 1/0201; H05K 1/113; H05K 1/144; H05K 1/02; H05K 1/11; H05K 2201/042; H05K 2201/09845; H05K 2201/10166; H05K 2201/10303; H05K 2203/107; H05K 3/30; H05K 3/3421
(Continued)

(56) References Cited

U.S. PATENT DOCUMENTS 5,460,531 A * 10/1995 Vivio ................... H05K 7/1092
439/70
6,376,782 B1 * 4/2002 Kimura ............. H01L 23/49811
257/E23.068
(Continued)

FOREIGN PATENT DOCUMENTS

CN 201608306 U 10/2010
CN 111092536 B 7/2021

*Primary Examiner* — Timothy J Thompson
*Assistant Examiner* — Guillermo J Egoavil
(74) *Attorney, Agent, or Firm* — KIRTON McCONKIE; Evan R. Witt

(57) ABSTRACT

A power module and a manufacturing method are provided. The power module includes a first electronic assembly and a second electronic assembly. The first electronic assembly includes at least one pin. The second electronic assembly includes a first surface and a second surface opposite to each other. The first surface is more adjacent to the first electronic assembly than the second surface. A direction from the first surface toward the second surface is defined as a reference direction. The second electronic assembly includes a first region and a second region. The first region has a first thickness in the reference direction. The second region has a second thickness in the reference direction. The second thickness is less than the first thickness. The second region includes at least one through hole. The pin is penetrated through the at least one through hole and fixed on the second electronic assembly.

14 Claims, 7 Drawing Sheets

(51) Int. Cl.
*H05K 1/11* (2006.01)
*H05K 3/30* (2006.01)
(58) Field of Classification Search
USPC .......................................................... 174/250
See application file for complete search history.

(56) References Cited

U.S. PATENT DOCUMENTS

| | | | |
|---|---|---|---|
| 2008/0305582 A1* | 12/2008 | Fillion | H01L 23/5385 |
| | | | 438/118 |
| 2021/0328369 A1* | 10/2021 | Wu | H01R 13/6477 |
| 2022/0346219 A1* | 10/2022 | Hasegawa | H05K 1/028 |
| 2023/0178910 A1* | 6/2023 | Kim | H01L 23/5386 |
| | | | 361/743 |

* cited by examiner

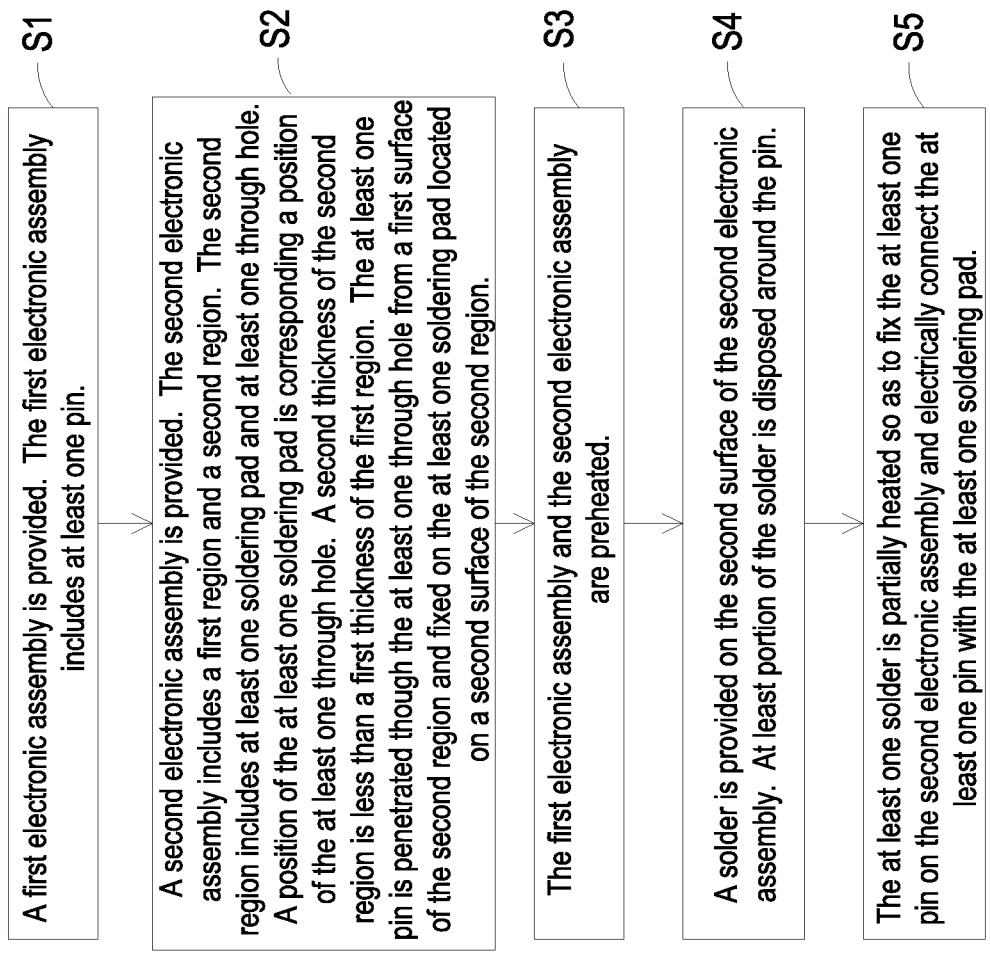

POWER MODULE AND MANUFACTURING METHOD THEREOF

CROSS-REFERENCE TO RELATED APPLICATION

This application claims priority to China Patent Application No. 202210134656.7 filed on Feb. 14, 2022. The entire contents of the above-mentioned patent application are incorporated herein by reference for all purposes.

FIELD OF THE INVENTION

The present disclosure relates to a power module and a manufacturing method of the power module, and more particularly to a power module having a circuit board with a groove and a manufacturing method of the power module.

BACKGROUND OF THE INVENTION

The power module includes a substrate, a circuit board and a plurality of electronic components. The electronic components are disposed on the circuit board. The substrate and the circuit board are stacked with each other. The substrate and the circuit board are connected to each other by inserting the pins fixed on the substrate into the through holes of the circuit board. For enhancing the output power from the power module, the thickness of the circuit board of the power module is increased. Moreover, the pins of the substrate and the through holes of the circuit board of the power module are connected to each other by automation soldering, such as wave soldering or selective soldering. When the thickness of the circuit board of the conventional power module is increased, the filing efficiency of the solder filled in the through holes of the circuit board may reduce. Moreover, the residue of the solder such as tin bead or tin slag is easy to be produced after soldering. In addition, for achieving the miniaturization of the power module, the electronic components are disposed on the circuit board more closely, and the flash distance between the electronic components disposed on the circuit board is reduced. Consequently, the electronic components may short-circuited with each other easily when the soldering progress is proceeded. Under some circumstances, the pin of the substrate is soldered with its root to fix and electrically connect with the external circuit board. Consequently, the regular automation soldering equipment can't be employed and artificial soldering can only be utilized. The soldering efficiency of the conventional power module is reduced, and the manufacture time of the conventional power module is increased.

SUMMARY OF THE INVENTION

An object of the present disclosure provides a power module and a manufacturing method of the power module. The power module and the manufacturing method of the power module have advantage of enhancing filling efficiency, enhancing soldering efficiency and enhancing product yield.

In accordance with an aspect of the present disclosure, a power module is provided. The power module includes a first electronic assembly and a second electronic assembly. The first electronic assembly includes at least one pin. The second electronic assembly includes a first surface and a second surface opposite to each other. The first surface is more adjacent to the first electronic assembly than the second surface. A direction from the first surface toward the second surface is defined as a reference direction. The second electronic assembly further includes a first region and a second region. The first region has a first thickness in the reference direction. The second region has a second thickness in the reference direction. The second thickness is less than the first thickness. The second region includes at least one through hole. The at least one pin is penetrated through the at least one through hole and fixed on the second electronic assembly.

In accordance with another aspect of the present disclosure, a manufacturing method of a power module is provided. Firstly, a first electronic assembly is provided. The first electronic assembly includes at least one pin. Then, a second electronic assembly is provided. The second electronic assembly includes a first region and a second region. The second region includes at least one soldering pad and at least one through hole. A position of the at least one soldering pad is corresponding to a position of the at least one through hole. A second thickness of the second region is less than a first thickness of the first region. The at least one pin is penetrated though the at least one through hole from a first surface of the second region and fixed on the at least one soldering pad located on a second surface of the second region. Then, the first electronic assembly and the second electronic assembly are preheated. Then, a solder is provided on the second surface of the second electronic assembly, and at least one portion of the solder is disposed around the at least one pin. Finally, the solder is partially heated so as to fix the at least one pin on the second electronic assembly and electrically connect with the at least one soldering pad.

The above contents of the present disclosure will become more readily apparent to those ordinarily skilled in the art after reviewing the following detailed description and accompanying drawings, in which:

BRIEF DESCRIPTION OF THE DRAWINGS

FIG. 5 is a flowchart illustrating a manufacturing method of the power module of FIG. 1 according to an embodiment of the present disclosure.

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
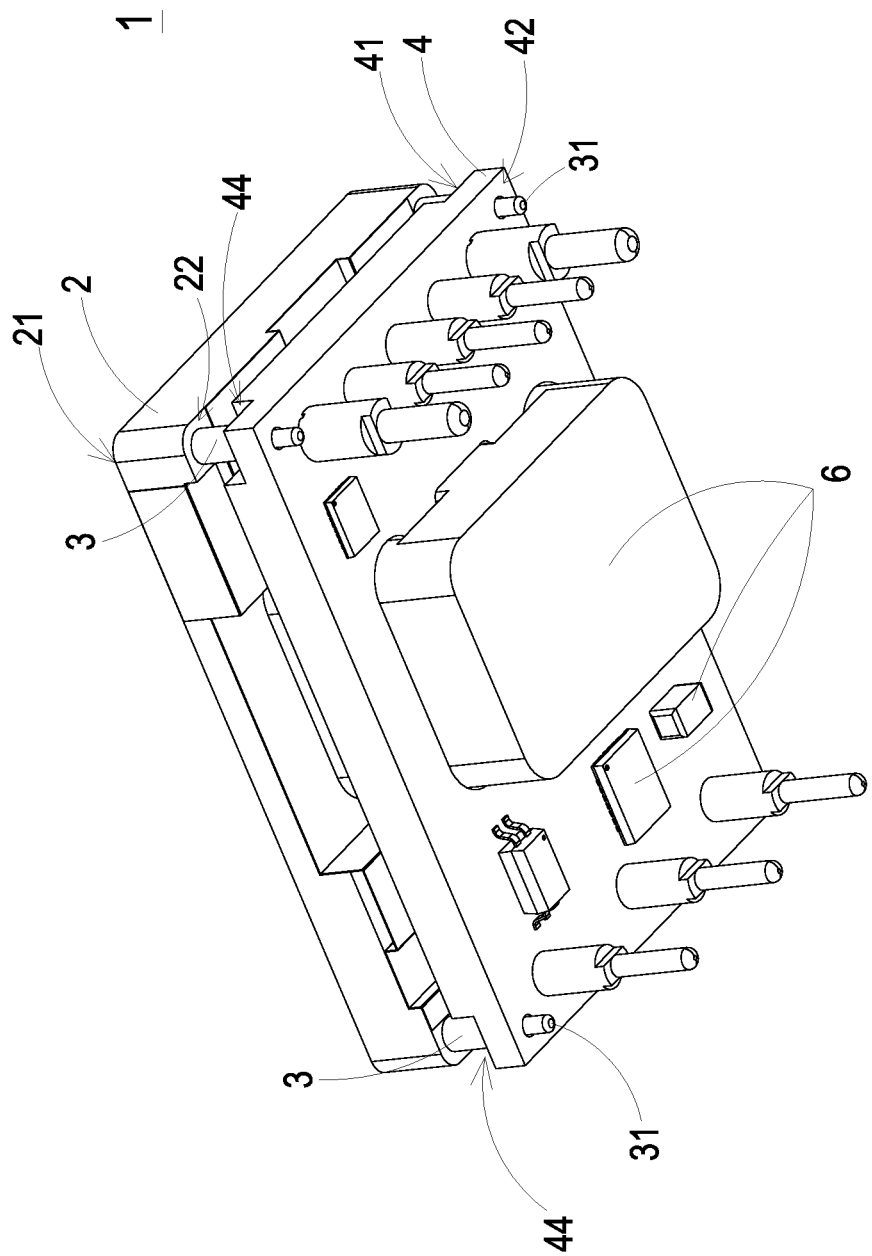
FIG. 1 is a schematic perspective view illustrating a power module according to a first embodiment of the present disclosure.

FIG. 1 is a schematic perspective view illustrating a power module according to a first embodiment of the present disclosure. FIGS. 2A to 2D are schematic cross-sectional views illustrating a manufacturing method of the power module of FIG. 1. Please refer to FIGS. 1, and 2A to 2D. The power module 1 of this embodiment includes a first electronic assembly, a plurality of pins 3, a second electronic assembly and a plurality of solders 5. The first electronic assembly includes a substrate 2 and a plurality of electronic components disposed on the substrate 2. The second electronic assembly includes a first circuit board 4 and a plurality of electronic components 6 disposed on the first circuit board 4.

Preferably but not exclusively, the substrate 2 includes a heat-dissipating substrate to dissipate the heat of the power module 1. The substrate 2 includes a first surface 21 and a second surface 22. The first surface 21 and the second surface 22 of the substrate 2 are opposite to each other. Each of the plurality of pins 3 includes a first end 31 and a second end 32. The second end 32 of each of the plurality of pins 3 is disposed and fixed on the substrate 2. In some embodiments, the second end 32 of each of the plurality of pins 3 is protruded from the second surface 22 and disposed on the substrate 2. The first end 31 of each of the plurality of pins 3 is extended away the substrate 2. In this embodiment, the plurality of pins 3 and the substrate 2 are connected to each other by utilizing the riveted joint. For simplifying the figures, in FIGS. 2A to 2D only one of the plurality of pins 3 is shown and the substrate 2 is omitted. It is noted that the fixing method of the pins 3 is not limited to above embodiment and is adjustable according to the practical requirements.

Figure 2A:
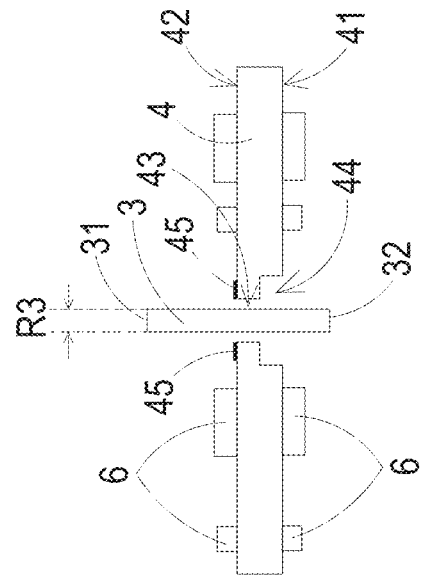
FIGS. 2A to 2D are schematic cross-sectional views illustrating a manufacturing method of the power module of FIG. 1.

As shown in FIGS. 1 and 2A, the thickness of the first circuit board 4 is greater than or equal to 2 mm, but not limited thereto. The first circuit board 4 includes a first surface 41, a second surface 42, a plurality of first through holes 43, a plurality of grooves 44 and a plurality of soldering pads 45. For easy understanding, the substrate 2 of FIGS. 2A to 2D is omitted, and one of the plurality of pins 3, one of the plurality first through holes 43 and one of the plurality of grooves 44 are shown in FIGS. 2A to 2D for illustration purpose. Each of the plurality of pins 3, each of the plurality of the first through holes 43 and each of the plurality of grooves 44 of the power module 4 of FIG. 1 are similar to the pin 3, the first through hole 43 and the groove 44 of FIGS. 2A to 2D, respectively. Similarly, one of the plurality of soldering pads 45 and one of the plurality of solders 5 are shown in FIGS. 2A to 2D for illustration purpose. In this embodiment, the first surface 41 and the second surface 42 of the first circuit board 4 are opposite to each other. The first surface 41 of the first circuit board 4 is located between the second surface 42 of the first circuit board 4 and the second surface 22 of the substrate 2, so that the first surface 41 of the first circuit board 4 is more adjacent to the substrate 2 than the second surface 42 of the first circuit board 4.

In this embodiment, the direction from the first surface 41 toward the second surface 42 of the first circuit board 4 is defined as a reference direction. The first circuit board 4 includes at least two regions based on different thicknesses in the reference direction. For example, the at least two regions include a first region and a second region. The first region is a region of the first circuit board 4 having complete plate without any groove. The first region has a first thickness in the reference direction. The second region is a region of the first circuit board 4 having the groove 44. The second region has a second thickness in the reference direction. The second thickness of the second region is less than the first thickness of the first region.

As shown in FIG. 2A, the second region includes the groove 44 and the first through hole 43. The groove 44 is concavely formed from the first surface 41 of the first circuit board 4. Namely, the second region and the first region are not coplanar with each other in the first surface 41 of the first circuit board 4, and the second region and the first region are coplanar with each other in the second surface 42 of the first circuit board 4. Certainly, in some other embodiments, the groove 44 is not only disposed on the first surface 41 of the first circuit board 4 but also may disposed on the second surface 42 of the first circuit board 4. Consequently, the second region and the first region are not coplanar with each other in the first surface 41 of the first circuit board 4, and the second region and the first region are not coplanar with each other in the second surface 42 of the first circuit board 4. The arrangement of the groove disposed on the second surface 42 is similar to the arrangement of the groove disposed on the first surface 41, and are not redundantly described hereinafter. The first through hole 43 runs through the second region of the first circuit board 4 through the second surface 42 of the first circuit board 4 and is in communication with the corresponding groove 44. The groove 44 and the first through hole 43 in communication with each other run through the first circuit board 4. The projection of the groove 44 on the second surface 42 are totally overlapped with the projection of the first through hole 43 on the second surface 42. The cross-sectional area of the groove 44 is greater than the cross-sectional area of the corresponding first through hole 43. As shown in FIG. 1, the position of the groove 44 is adjacent to the outer periphery of the first circuit board 4. Alternatively, the groove 44 is away from the outer periphery of the first circuit board 4. It is noted that the position, the shape and the size of the groove 44 are not limited to the above embodiment and can be adjusted according to the practical requirements. For showing the groove 44 in FIGS. 2A to 2D clearly, the groove 44 is away from and not adjacent to the outer periphery of the first circuit board 4. In this embodiment, the thickness H2 of the first region of the first circuit board 4 is equal to the thickness between the first surface 41 and the second surface 42 of the first circuit board 4. Preferably but not exclusively, the thickness H2 is greater than or equal to 2 mm. The depth H1 of the first through hole 43 (i.e., the second thickness of the second region of the first circuit board 4) is less than the thickness H2 of the first region of the first circuit board 4. For example, the depth H1 of the first through hole 43 (i.e., the second thickness of the second region of the first circuit board 4) is between 1 mm to 1.8 mm. The soldering pad 45 is disposed on the second surface 42 of the first circuit board 4. The position of the soldering pad 45 is corresponding to the position of the first through hole 43. For example, the soldering pad 45 is disposed around the first through hole 43. The size and the shape of the soldering pad 45 are not limited, and can be adjusted according to the practical requirements.

Figure 2B:
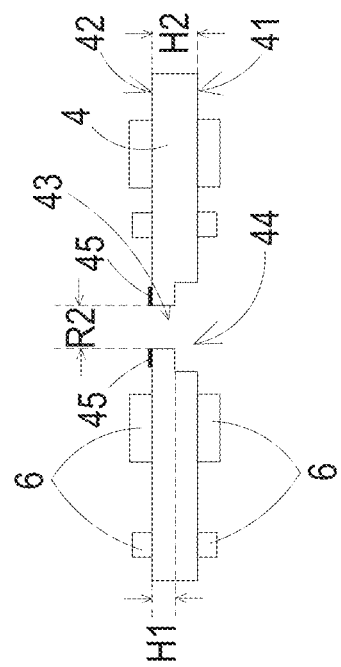
Figure 2C:
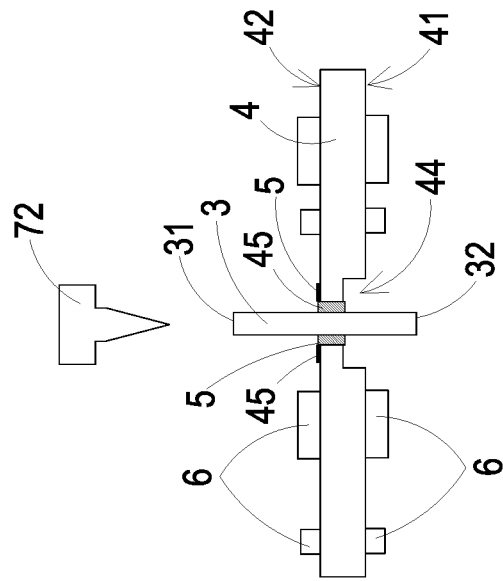

Then, as shown in FIG. 2B, the cross-sectional diameter R3 of the pin 3 is less than the diameter R2 of the first through hole 43. The first end 31 of the pin 3 is penetrated through the corresponding first through hole 43 from the first surface 41 to the second surface 42 of the first circuit board 4. Consequently, the first end 31 of the pin 3 is protruded from the second surface 42 of the first circuit board 4, and the second end 32 of the pin portion 3 is protruded from the first surface 41 of the first circuit board 4. Then, as shown in FIG. 2C, the material of the solder 5 is solder paste, but not limited thereto. The solder 5 is provided by a spot-welding device 71 such as solder paste welding device. The solder 5 is disposed on the soldering pad 45 located on the second surface 42 of the first circuit board 4.

Figure 2D:
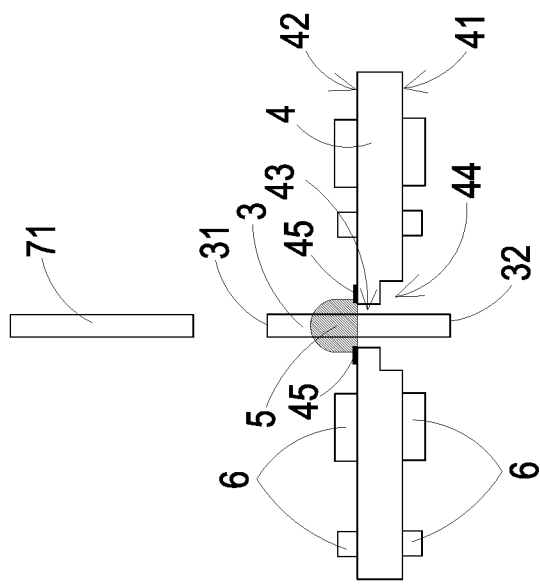

Then, as shown in FIG. 2D, the solder 5 is melted by the external laser 72 by means of local heating welding (e.g., laser welding), so that portion of the solder is filled into the gap between the inner lateral surface of the first through hole 43 and the pin 3. Another portion of the solder 5 is disposed on the soldering pad 45 located on the second surface 42 of the first circuit board 4 so as to at least partially surround the pin 3. Moreover, portion of the solder 5 is protruded from the first surface 41 of the first circuit board 4 so as to fix the pin 3 on the first circuit board 4. In this embodiment, the definition of local heating welding is that the external laser 72 is directly aimed at the solder 5, so that only the solder 5 on the first circuit board 4 is heated by the external laser 72, and the remaining components disposed on the first circuit board 4 are not heated. Certainly, the soldering pad 45 is not limited to be disposed on the second surface 42 of the first circuit board 4. Alternatively, the soldering pad 45 can be disposed on the substrate 2 (i.e., the first electronic assembly). Consequently, the pin 3 can also be fixed on the substrate 2 by means of locating heating welding. The arrangement of the soldering pad 45 disposed on the substrate 2 is similar to the arrangement of the soldering pad 45 disposed on the second surface 42 of the first circuit board 4, and is not redundantly described hereinafter.

As shown in FIG. 1, the plurality of electronic components 6 are disposed on the second surface 42 of the first circuit board 4. The heat generated from the plurality of electronic components 6 and the heat generated from the first circuit board 4 are transferred to the substrate 2 through the pin 3 for dissipating the heat. By utilizing the laser welding, the problem that the conventional automation soldering (e.g., wave soldering or selective soldering) can't be utilized due to the flash distance between the soldering point and the surrounding electronic components is too close or the component needs root welding can be solved. Consequently, the manufacture time of the present disclosure is reduced and the soldering yield of the present disclosure is enhanced. Certainly, the plurality of electronic components 6 are not limited to be disposed on the second surface 42 of the first circuit board 4. In some embodiments, the plurality of electronic components 6 can be disposed on the first surface 41 and the second surface 42 of the first circuit board 4. The local heating welding can avoid the problem of dropping or shifting of the plurality of electronic components 6 in all the above embodiments more effectively when soldering again. Consequently, the product failure rate of the power module 1 in the production process is reduced effectively.

From above, the depth H1 of the first through hole 43 (i.e., the second thickness of the second region of the first circuit board 4) of the power module 1 of the present disclosure is less than the thickness H2 of the first circuit board 4 (i.e., the first thickness of the first region of the first circuit board 4). The pin 3 is penetrated through the first circuit board 4 through the first through hole 43. Portion of the solder 5 is disposed in the gap between the inner lateral surface of the first through hole 43 and the pin 3, and other portion of the solder 5 is protruded from the first surface 41 and the second surface 42 of the first circuit board 4. Consequently, the depth H1 of the first through hole 43 of the power module 1 of the present disclosure is decreased so as to reduce the heat dissipation of filling the solder 5 in the gap between the inner lateral surface of the first through hole 43 and the pin 3. In other words, the heat generated from the soldering region of the first circuit board 4 for the solder 5 is increased, so that the solder 5 is capable of being filled into the gap between the inner lateral surface of the first through hole 43 and the pin 3 easily. Consequently, the filling rate and the soldering efficiency of the solder 5 are enhanced. The residue of the solder 5 is not easy to be produced. The soldering quality and the soldering efficiency are enhanced. Moreover, the power module 1 of the present disclosure utilizes the local heating welding method to dispose portion of the solder 5 in the gap between the inner lateral surface of the first through hole 43 and the pin 3 and dispose another portion of the solder 5 on the soldering pad 45 located on the second surface 42 of the first circuit board 4. Furthermore, the other portion of the solder 5 is protruded from the first surface 41 of the first circuit board 4. Consequently, the automatic soldering process for the electronic components having shorter flash distance or electronic components required to be soldered with its root can be achieved. The problem of dropping and shifting of the other electronic components during soldering can be avoided. The electronic components are not short-circuited with each other. Consequently, the production efficiency and the product yield of the power module 1 of the present disclosure are enhanced.

In some embodiments, the substrate 2 includes a second through hole (not shown). Preferably but not exclusively, the second end 32 of the pin 3 is penetrated though the substrate 2 through the corresponding second through hole, and then the second end 32 of the pin 3 is connected to the substrate 2 by utilizing the riveted joint or SMT soldering, but is not limited thereto. The groove 44 is formed on the first surface 41 of the first circuit board 4, and then the first end 31 of the pin 3 is penetrated though the first circuit board 4 through the corresponding first through hole 43 to connect with the first circuit board 4 by above-mentioned connection method. In an embodiment, the pin 3 and the substrate 2 are integrally formed into one piece.

Figure 4:
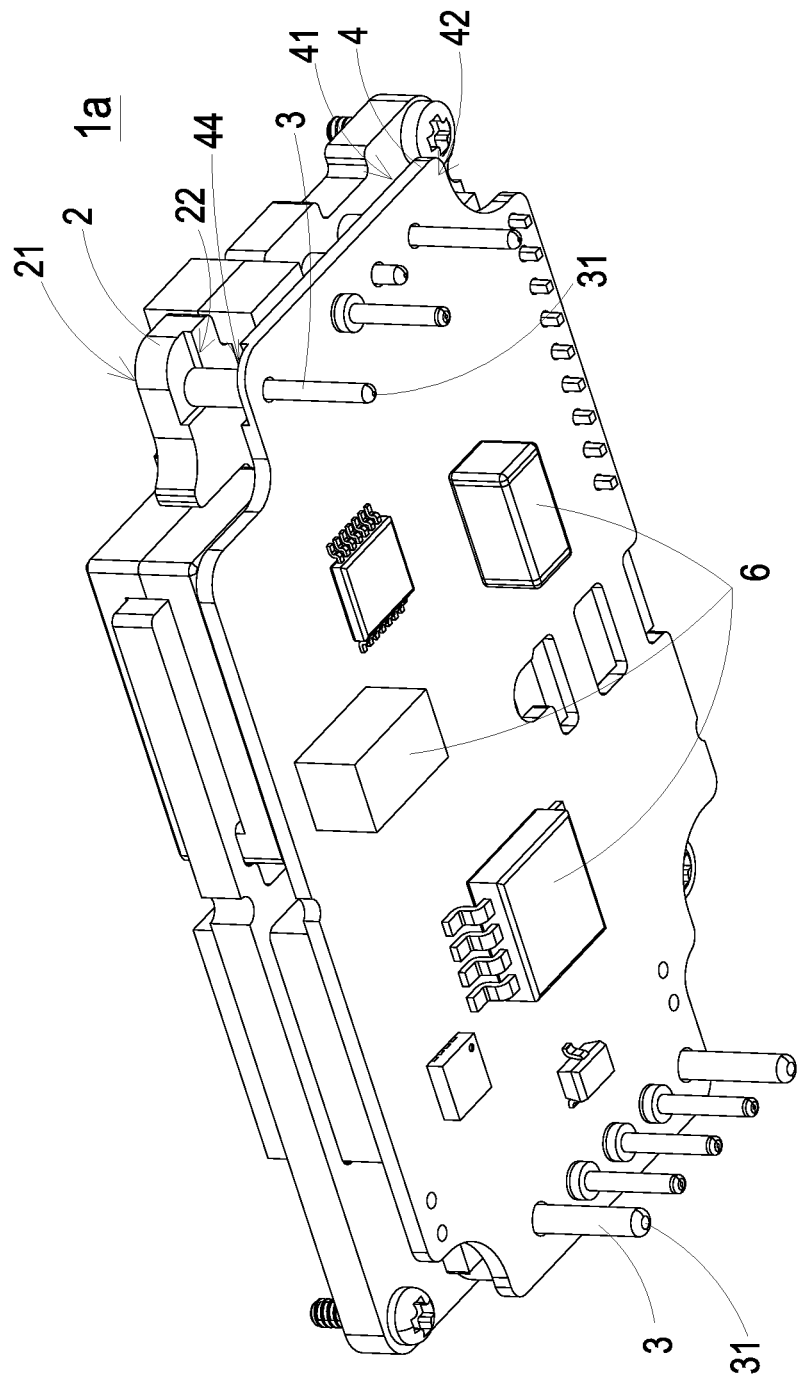
FIG. 4 is a schematic perspective view illustrating a power module according to a second embodiment of the present disclosure.

In some embodiments, the substrate 2 may include no heat-dissipating substrate. FIG. 4 is a schematic perspective view illustrating a power module according to a second embodiment of the present disclosure. The power module 1a of this embodiment is similar to the power module 1 of FIG. 1. In this embodiment, the substrate 2 includes a second circuit board having a structure similar to that of the first circuit board 4. The second circuit board includes a first surface, a second surface, a plurality of second through holes, a plurality of grooves and a plurality of soldering pads. The plurality of electronic components are disposed on the first surface and/or the second surface of the second circuit board. The plurality of grooves and the plurality of soldering pads are disposed on the second region of the first circuit board 4, respectively. The substrate 2 and the first circuit board 4 are connected to each other through the pin 3. Furthermore, the signal generated from the electronic component 6 is transmitted to the substrate 2 through the first circuit board 4 and the pin 3 in sequence. Portion of the solder 5 is disposed in the gap between the inner lateral surface of the second through hole and the pin 3, and the other portion of the solder 5 is protruded from the surface of the substrate 2 so as to fix the pin 3 on the substrate 2. The method of disposing the solder 5 of this embodiment in the gap between the inner lateral surface of the second through hole and the pin 3 is similar to the method of disposing the solder 5 of the first embodiment in the gap between the inner lateral surface of the first through hole 43 and the pin 3, and is not redundantly described hereinafter.

Figure 3A:
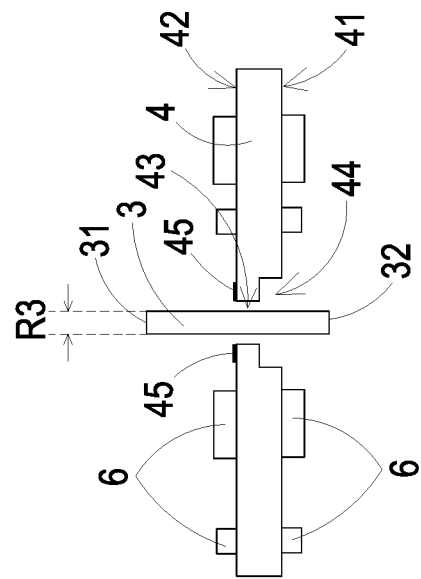
FIGS. 3A to 3D are schematic cross-sectional views illustrating another manufacturing method of the power module of FIG. 1.
Figure 3B:
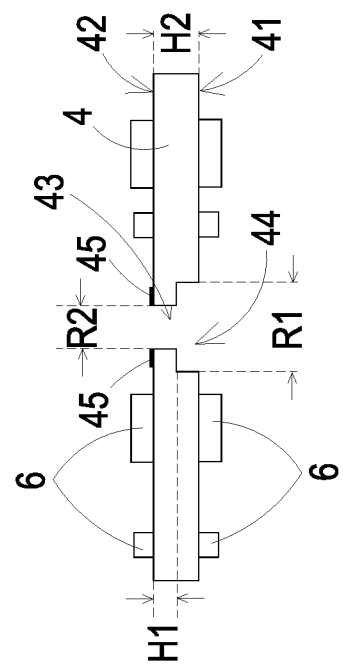
Figure 3C:
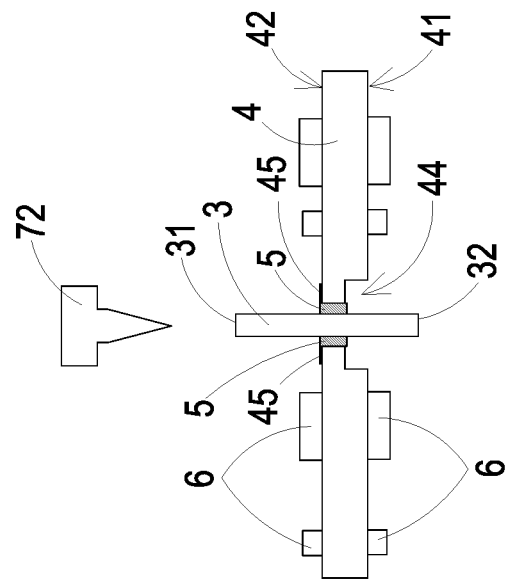
Figure 3D:
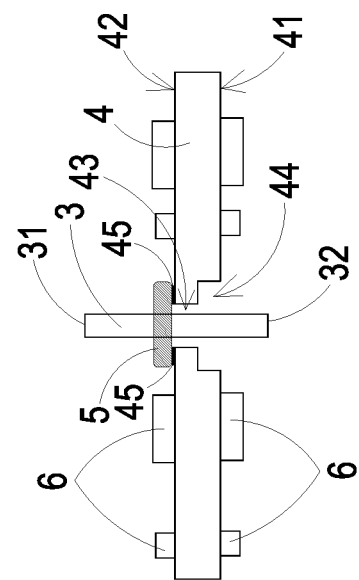

In some embodiments, the solder 5 includes the solder paste. For controlling the consumption of the solder 5, preferably but not exclusively, the solder 5 includes the tin ring or the tin wire. FIGS. 3A to 3D are schematic cross-sectional view illustrating another manufacturing method of the power module of FIG. 1. The structures and manufacturing method as shown in FIGS. 3A, 3B and 3D of this embodiment are similar to that as shown in FIGS. 2A, 2B and 2D of the first embodiment and are not redundantly described hereinafter. In this embodiment, the solder 5 includes the tin ring. The solder 5 has a center hole located in the center of the solder 5. The diameter of the center hole is greater than or equal to the cross-sectional diameter R3 of the pin 3. When the solder 5 is disposed on the soldering pad 45 located on the second surface 42 of the first circuit board 4, the center hole of the solder 5 is corresponding to the first through hole 43 of the first circuit board 4. When the first end 31 of the pin 3 is penetrated though the first circuit board 4 through the corresponding first through hole 43, the solder 5 is disposed around the pin 3. In an embodiment, the solder 5 includes the tin wire. The solder 5 is disposed above the gap between the inner lateral surface of the first through hole 43 and the pin 3, and is contacted with the soldering pad 45 located on the second surface 42 of the first circuit board 4. Preferably but not exclusively, the solder 5 is heated by the spot-welding device 71 or the external laser 72.

FIG. 5 is a flowchart illustrating a manufacturing method of the power module of FIG. 1 according to an embodiment of the present disclosure. Firstly, a step S1 is performed. In the step S1, a first electronic assembly is provided. The first electronic assembly includes at least one pin 3. In this embodiment, the first electronic assembly includes the substrate 2 and the electronic components disposed on the substrate 2 as shown in FIG. 1. Then, a step S2 is performed. In the step S2, a second electronic assembly is provided. The second electronic assembly includes a first surface 41, a second surface 42, a first region and a second region. In this embodiment, the second electronic assembly includes the first circuit board 4 and the electronic components disposed on the first circuit board 4 as shown in FIG. 1. The second surface 42 includes at least one soldering pad 45. The second region includes at least one first through hole 43 corresponding to the at least one soldering pad 45. The second thickness of the second region is less than the first thickness of the first region. The pin 3 is penetrated though the first through hole 43 from the first surface 41 to the second surface 42 and fixed on the soldering pad 45 located on the second surface 42. Then, a step S3 is performed. In the step S3, the first electronic assembly and the second electronic assembly are preheated. Then, a step S4 is performed. In the step S4, the solder 5 is provided on the second surface 42 of the second electronic assembly. At least portion of the solder 5 is disposed around the pin 3. Finally, a step S5 is performed. In the step S5, the solder 5 is partially heated so as to fix the pin 3 on the second electronic assembly and electrically connect the pin 3 to the soldering pad 45.

From the above descriptions, the present disclosure provides a power module. The depth of the first through hole of the power module of the present disclosure is less than the thickness of the first circuit board. The pin is penetrated through the first circuit board through the first through hole. Portion of the solder is disposed in the gap between the inner lateral surface of the first through hole and the pin, and another portion of the solder is disposed on the soldering pad located on the second surface of the first circuit board. Moreover, portion of the solder is protruded from the first surface of the first circuit board. Consequently, the depth of the first through hole of the power module of the present disclosure is decreased so as to reduce the heat dissipation of filling the solder in the gap between the inner lateral surface of the first through hole and the pin. In other words, the heat of the solder generated from the soldering region of the first circuit board is increased so as to fill the gap between the inner lateral surface of the first through hole and the pin easily. Consequently, the filling rate and the soldering efficiency of the solder are enhanced. The residue of the solder is not easy to be produced. The soldering quality and the soldering efficiency are enhanced. Moreover, the power module of the present disclosure utilizes the local heating welding method so that the automatic soldering process for the electronic components having shorter flash distance or electronic components required to be soldered with its root can be achieved. The rest solder points of the electronic components of the power module will not be heated to be soldered. Consequently, the problem of dropping and shifting of the electronic components during soldering can be avoided. The electronic components are not short-circuited with each other. Consequently, the production efficiency and the production yield of the power module of the present disclosure are enhanced.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module, comprising:
a first electronic assembly comprising at least one pin; and
a second electronic assembly comprising a first surface and a second surface opposite to each other, wherein the first surface is more adjacent to the first electronic assembly than the second surface, and a direction from the first surface toward the second surface is defined as a reference direction, wherein the second electronic assembly further comprises:
a first region having a first thickness in the reference direction; and
a second region having a second thickness in the reference direction, wherein the second thickness is less than the first thickness, the second region comprises at least one through hole, the at least one through hole runs completely through the second electronic assembly, and the at least one pin is penetrated completely through the at least one through hole and fixed on the second electronic assembly.

2. The power module according to claim 1, wherein the first electronic assembly or the second electronic assembly comprises at least one soldering pad, a position of the at least one soldering pad is corresponding to a position of the at least one through hole, and the at least one soldering pad is disposed on the first electronic assembly or the second surface of the second electronic assembly.

3. The power module according to claim 1, wherein the first electronic assembly comprises a heat-dissipating substrate, and the second electronic assembly comprises a circuit board.

4. The power module according to claim 1, wherein the first electronic assembly and the second electronic assembly respectively comprise a circuit board.

5. The power module according to claim 1, wherein the first thickness is greater than or equal to 2 mm.

6. The power module according to claim 4, wherein the second thickness is between 1 mm to 1.8 mm.

7. The power module according to claim 1, wherein the first region and the second region are coplanar with each other in the second surface of the second electronic assembly, and the first region and the second region are not coplanar with each other in the first surface of the second electronic assembly.

8. The power module according to claim 1, wherein the first region and the second region are not coplanar with each other in the second surface of the second electronic assembly, and the first region and the second region are not coplanar with each other in the first surface of the second electronic assembly.

9. The power module according to claim 1, wherein a solder is local heated to fix the at least one pin on the first electronic assembly or the second electronic assembly, or both of the first electronic assembly and the second electronic assembly.

10. The power module according to claim 9, wherein the solder comprises a tin wire, a tin ring or a solder paste.

11. The power module according to claim 10, wherein the solder is disposed on the second surface of the second electronic assembly, and at least portion of the solder is disposed partially around the at least one pin.

12. The power module according to claim 10, wherein the solder is filled in a gap between an inner lateral surface of the at least one through hole and the at least one pin.

13. The power module according to claim 9, wherein the solder is local heated by laser welding.

14. A manufacturing method of a power module, comprising the steps of:
(a) providing a first electronic assembly, wherein the first electronic assembly comprises at least one pin;
(b) providing a second electronic assembly, wherein the second electronic assembly comprises a first region and a second region, the second region comprises at least one soldering pad and at least one through hole, the at least one through hole runs completely through the second electronic assembly, a position of the at least one soldering pad is corresponding to a position of the at least one through hole, wherein a second thickness of the second region is less than a first thickness of the first region, and the at least one pin is penetrated completely though the at least one through hole from a first surface of the second region and fixed on the at least one soldering pad located on a second surface of the second region;
(c) preheating the first electronic assembly and the second electronic assembly;
(d) providing a solder on the second surface of the second electronic assembly, wherein at least portion of the solder is disposed around the at least one pin; and
(e) locally heating the at least one solder so as to fix the at least one pin on the second electronic assembly and electrically connect the at least one pin with the at least one soldering pad.

* * * * *